(12) United States Patent
Liu et al.

(10) Patent No.: US 11,367,755 B2
(45) Date of Patent: Jun. 21, 2022

(54) DISPLAY PANEL WITH HIGH APERTURE RATIO, MANUFACTURING METHOD THEREOF, AND DISPLAY DEVICE

(71) Applicant: Shenzhen China Star Optoelectronics Semiconductor Display Technology Co., Ltd., Guangdong (CN)

(72) Inventors: Jianxin Liu, Guangdong (CN); Baixiang Han, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 213 days.

(21) Appl. No.: 16/765,431

(22) PCT Filed: May 12, 2020

(86) PCT No.: PCT/CN2020/089703
§ 371 (c)(1),
(2) Date: May 19, 2020

(87) PCT Pub. No.: WO2021/169047
PCT Pub. Date: Sep. 2, 2021

(65) Prior Publication Data
US 2022/0115444 A1    Apr. 14, 2022

(30) Foreign Application Priority Data
Feb. 27, 2020    (CN) .................. 202010124760.9

(51) Int. Cl.
*H01L 27/32* (2006.01)
*H01L 51/56* (2006.01)

(52) U.S. Cl.
CPC ........ *H01L 27/322* (2013.01); *H01L 27/3246* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 10,553,622 | B2* | 2/2020 | Lee ........................ H01L 27/322 |
| 2012/0262642 | A1* | 10/2012 | Ikeda ..................... H01L 27/124 |
| | | | 438/34 |
| 2015/0090985 | A1* | 4/2015 | Park ..................... H01L 51/5209 |
| | | | 257/40 |
| 2019/0181385 | A1* | 6/2019 | Seong ................... H01L 27/322 |

* cited by examiner

*Primary Examiner* — J. E. Schoenholtz

(57) ABSTRACT

A display panel with a high aperture ratio, a manufacturing method thereof, and a display device are provided. The display panel includes effective light emitting regions and invalid light emitting regions. Added opening regions are further defined on the invalid light emitting regions of the display panel. Color filter layers are formed in the added opening regions. Regions where the color filter layers in the added opening regions on the display panel are located on are added effective light emitting regions. An aperture ratio and a pixel density of the display panel can be increased to achieve a purpose of improving display effect of the display panel.

17 Claims, 4 Drawing Sheets

(a)

(b)

DISPLAY PANEL WITH HIGH APERTURE RATIO, MANUFACTURING METHOD THEREOF, AND DISPLAY DEVICE

FIELD OF INVENTION

The present disclosure relates to the field of communication technology, and more specifically relates to a display panel with a high aperture ratio, a manufacturing method thereof, and a display device.

BACKGROUND OF INVENTION

Organic light emitting display panels have advantages such as self-illumination without a backlight, low power consumption, high brightness, small dimensions, etc., and are widely used in various electronic equipment and favored by users.

Pixel arrangement approaches directly affect display effect of the organic light emitting display panels. In order to obtain organic light emitting display panels with better display effect, the pixel arrangement approaches have become a research hotspot in current field of organic light emitting displays. There are many kinds of commonly used pixel arrangement approaches of organic light emitting display panels in the prior art; however, all of them cannot balance good display effect, high pixel density, and high aperture ratio.

The technical problem is that commonly used pixel arrangement approaches of organic light emitting display panels in the prior art cannot balance good display effect, high pixel density, and high aperture ratio.

SUMMARY OF INVENTION

The present disclosure provides a display panel with a high aperture ratio. The display panel includes effective light emitting regions and invalid light emitting regions. Added opening regions are further defined on the invalid light emitting regions of the display panel. Color filter layers are formed in the added opening region. Regions where the color filter layers in the added opening region on the display panel located on are added effective light emitting regions.

The present disclosure further provides a display device. A display panel of the display device includes effective light emitting regions and invalid light emitting regions. Added opening regions are further defined on the invalid light emitting regions of the display panel. Color filter layers are formed in the added opening regions. Regions where the color filter layers in the added opening regions on the display panel are located on are added effective light emitting regions.

The present disclosure further provides a manufacturing method of a display panel with a high aperture ratio, including:

providing the display panel, wherein the display panel includes effective light emitting regions and invalid light emitting regions; and defining added opening regions on the invalid light emitting regions of the display panel, and forming color filter layers in the added opening regions, regions where the plurality of color filter layers in the plurality of added opening regions on the display panel are located on are a plurality of added effective light emitting regions.

The present disclosure provides a display panel with a high aperture ratio, a manufacturing method thereof, and a display device. The added opening regions are defined on the invalid light emitting regions of the display panel. On the basis of the added opening regions, one or a plurality of the effective light emitting regions can be added on the invalid light emitting regions. Therefore, based on the method provided by the present disclosure, the aperture ratio and the pixel density of the display panel can be increased to achieve the purpose of improving display effect of the display panel.

DESCRIPTION OF DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
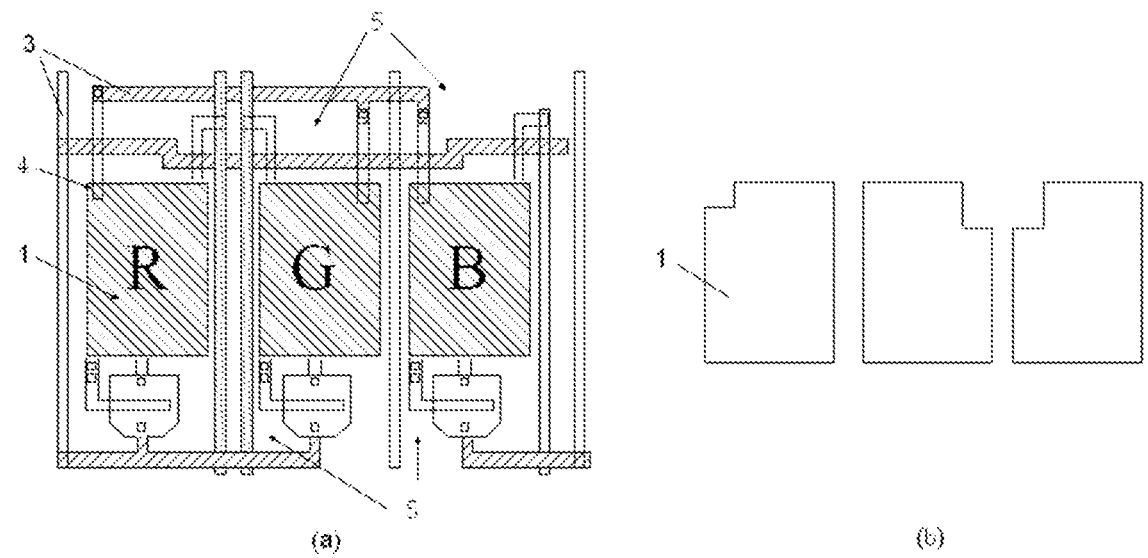
FIG. 1 is a pixel schematic diagram and a pixel opening region schematic diagram of a traditional display panel.

In order to allow the above and other purposes, features, and advantages of the present disclosure to be more obvious and easy to understand, the technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the present disclosure, unless expressly specified or limited otherwise, a first feature is "on" or "beneath" a second feature may include that the first feature directly contacts the second feature and may also include that the first feature does not directly contact the second feature. Furthermore, a first feature "on," "above," or "on top of" a second feature may include an embodiment in which the first feature is right "on," "above," or "on top of" the second feature and may also include that the first feature is not right "on," "above," or "on top of" the second feature, or just means that the first feature has a sea level elevation higher than the sea level elevation of the second feature. While first feature "beneath," "below," or "on bottom of" a second feature may include that the first feature is "beneath," "below," or "on bottom of" the second feature and may also include that the first feature is not right "beneath," "below," or "on bottom of" the second feature, or just means that the first feature has a sea level elevation lower than the sea level elevation of the second feature.

The following disclosure provides many different embodiments or examples for implementing the different structures of the present disclosure. In order to simplify the disclosure of the present disclosure, the components and configurations of the specific examples are described below. Of course, they are merely examples and are not intended to limit the present disclosure. In addition, the present disclosure may repeat reference numerals and/or reference numerals in different examples, which are for the purpose of simplicity and clarity, and do not indicate the relationship between the various embodiments and/or arrangements discussed. Moreover, the present disclosure provides embodiments of various specific processes and materials, but one of ordinary skill in the art will recognize the use of other processes and/or the use of other materials.

Please refer to FIG. 1, wherein FIG. 1(a) is a pixel schematic diagram of a traditional display panel, and FIG. 1(b) is a pixel opening region schematic diagram of FIG. 1(a). It should be understood that effective light emitting regions of the traditional display panel are regions where color filter layers in the pixel opening region 1 are located on, and other regions of the display panel are invalid light emitting regions. From FIG. 1(a) and FIG. 1(b), it can be understood that there are non-transmissive modules such as a wiring 3 and a thin film transistor 4 as well as some other gaps 5 on the invalid light emitting regions of the traditional display panel, which make the invalid light emitting regions of the traditional display panel account for a large amount of an area. However, an area of the effective light emitting regions is not large enough. Therefore, an aperture ratio and a pixel density of the traditional display panel are not high, and it can be imagined that the display effect of the traditional display panel is actually not good enough.

An embodiment of the present disclosure provides a display panel with a high aperture ratio, which includes effective light emitting regions and invalid light emitting regions. Added opening regions are further defined on the invalid light emitting regions of the display panel. Color filter layers are formed in the added opening regions, so regions where the added opening regions of the display panel are located on are added effective light emitting regions.

In this embodiment, the effective light emitting regions of the display panel are the regions where the color filter layers in the pixel opening region are formed, and other regions of the display panel are the invalid light emitting regions.

The added opening regions are newly added opening regions on the invalid light emitting regions of the display panel. In the opening region, color filter sheets can be formed in the opening regions to obtain the effective light emitting regions, and the effective light emitting regions are added effective light emitting regions. Therefore, the display panel provided by the embodiment of the present disclosure has more effective light emitting regions, thereby having a high aperture ratio, a high pixel density, and excellent display effect.

The following is going to continue describing some other embodiments of the display panel provided by the present disclosure on the basis of the display panel mentioned above.

Same as the traditional display panel, there are non-transmissive modules such as a wiring and a thin film transistor as well as some other gaps which are transmissive in the display panel provided by the embodiment of the present disclosure. It should be understood that in the present disclosure, the non-transmissive modules include opaque modules such as a thin film transistor, a metal layer block or/and a black matrix, etc. The transmissive module includes transparent modules such as storage capacitors, etc.

In several embodiments, the added opening regions are defined on regions on the invalid light emitting regions of the display panel and are different from orthogonal projections of each of the non-transmissive modules.

Figure 2:
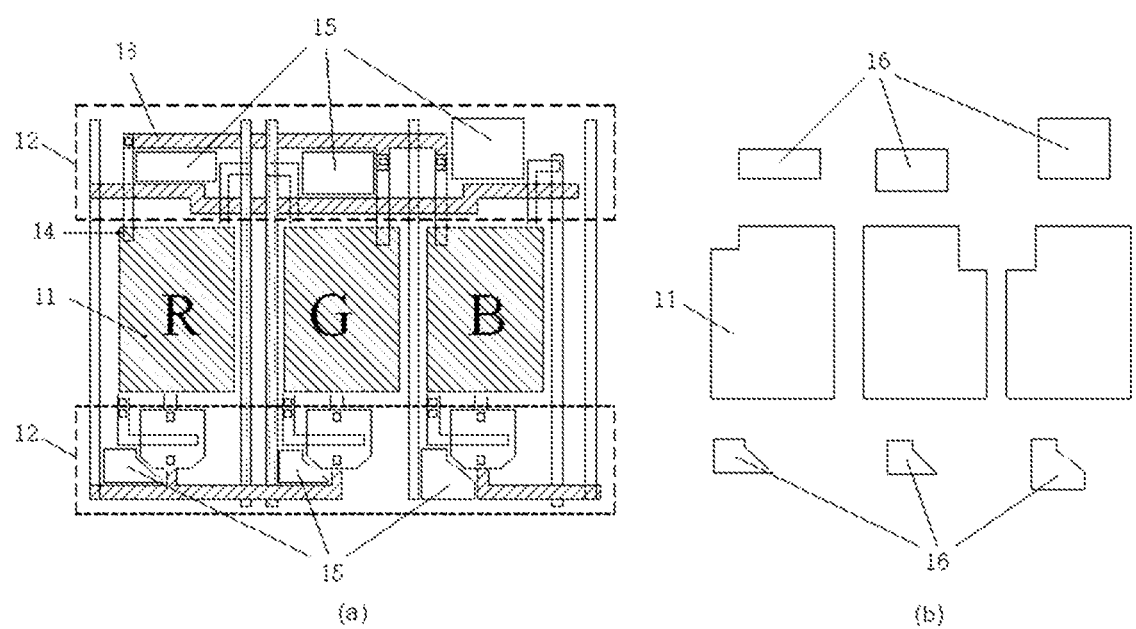
FIG. 2 is a pixel schematic diagram and a pixel opening region schematic diagram of a first display panel with a high aperture ratio provided by an embodiment of the present disclosure.

Please refer to FIG. 2(a), FIG. 2(a) is a pixel schematic diagram of the display panel provided by an embodiment of the present disclosure. Same as the traditional display panel, the display panel includes the effective light emitting regions 11 (regions where background patterns in FIG. 2 have "RGB" labels) and invalid light emitting regions 12 (regions within dotted line frames in FIG. 2). In the invalid light emitting regions 12, there are many wirings 13 and thin film transistors 14, and there are many gaps 15 between the wirings 13 and the thin film transistors 14.

Please refer to FIG. 2(b), FIG. 2(b) is a pixel opening region schematic diagram of FIG. 2(a). Added opening regions 16 are further defined on the invalid light emitting regions 12 on the display panel provided by the embodiment of the present disclosure. The added opening regions 16 are defined on the invalid light emitting regions 12 and are in the gaps 15 between the wirings 13 and the thin film transistors 14, that is, they are defined on the regions different from where orthogonal projections of each of the non-transmissive modules are located on.

Figure 3:
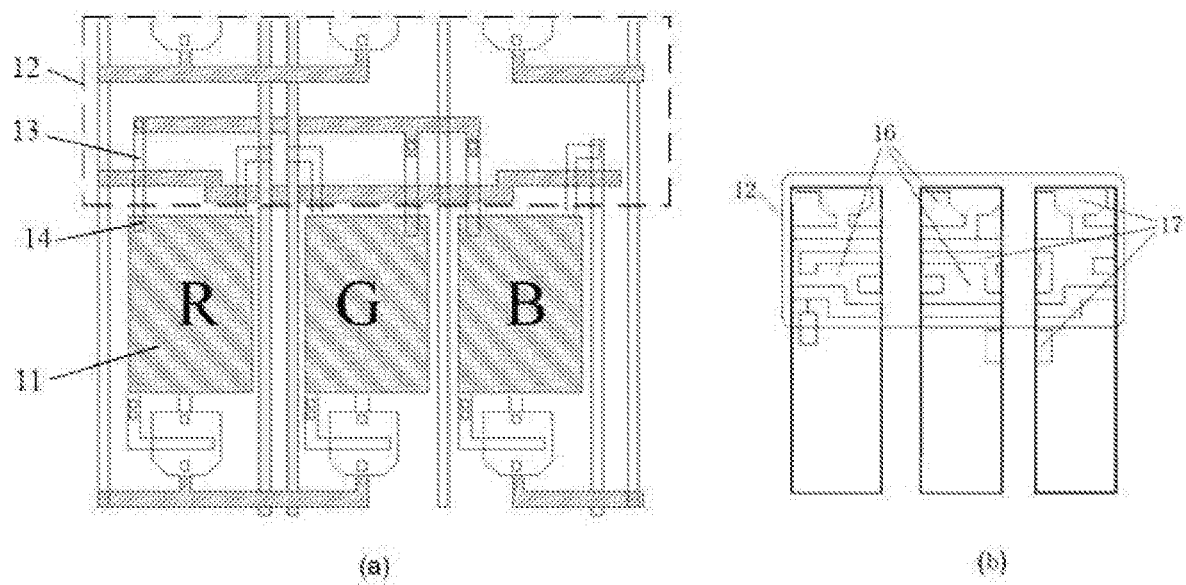
FIG. 3 is a pixel schematic diagram and a pixel opening region schematic diagram of a second display panel with a high aperture ratio provided by an embodiment of the present disclosure.

In should be understood that in the embodiment illustrated in FIG. 2, areas accounted by the added opening regions 16 are not large. In some of other examples in the embodiment, areas accounted by the added opening regions 16 can be increased as much as possible to obtain larger added effective regions. Please refer to FIG. 3, in this embodiment, the added opening regions 16 are further defined on the invalid light emitting regions 12 (regions within dotted line frames in FIG. 3) on the display panel. Regions outside of the added opening regions 16 are regions 17 where the opaque modules such as the wirings 13, the thin film transistors, etc. are located on.

In some other embodiments, the added opening regions are defined on the invalid light emitting regions of the display panel and cover and exceed regions where orthogonal projections of each of the non-transmissive modules are located on.

Figure 4:
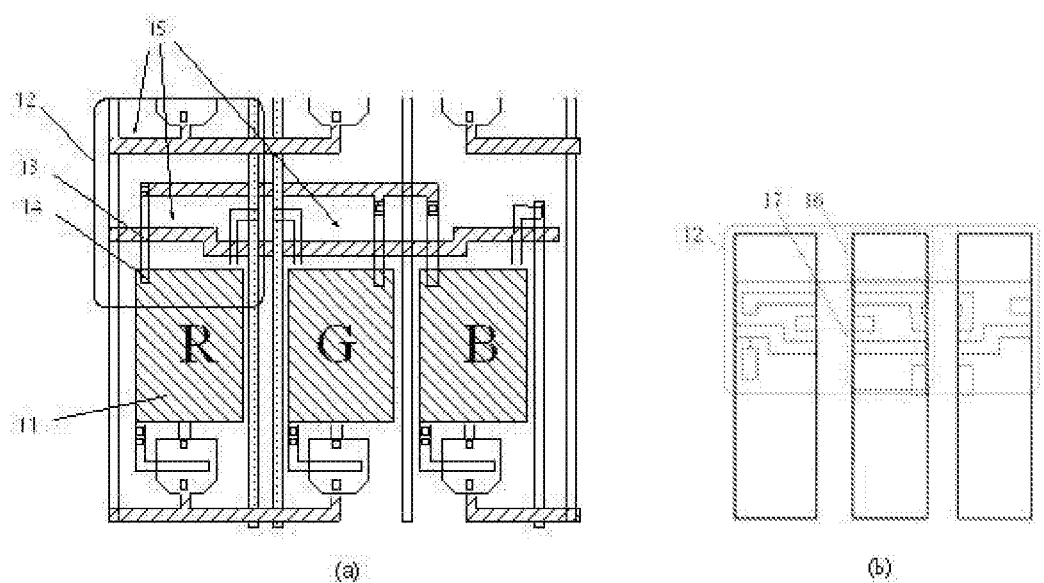
FIG. 4 is a pixel schematic diagram and a pixel opening region schematic diagram of a third display panel with a high aperture ratio provided by an embodiment of the present disclosure.

Please refer to FIG. 4(a), FIG. 4(a) is a pixel schematic diagram of the display panel provided by an embodiment of the present disclosure. Same as the traditional display panel, the display panel includes the effective light emitting regions 11 (regions where background patterns in FIG. 4 have "RGB" labels) and invalid light emitting regions 12 (regions within dotted line frames in FIG. 4). In the invalid light emitting regions 12, there are many wirings 13 and thin film transistors 14, and there are many gaps 15 between the wirings 13 and the thin film transistors 14.

Please refer to FIG. 4(b), FIG. 4(b) is a pixel opening schematic diagram of FIG. 4(a). The added opening regions 16 are further defined on the invalid light emitting regions 12 on the display panel provided by the embodiment. The added opening regions 16 are defined on the invalid light emitting regions 12 and cover the gaps 15 between the wirings 13 and the thin film transistors 14, that is, the added opening regions 16 cover and exceed regions where orthogonal projections of each of the non-transmissive modules are located on. This way, the advantage is that an opening usage rate of the gaps can be maximized. However, compared to the first kind, effective power consumption is relatively lower than the first kind incurred by adding the invalid light emitting regions occluded by the non-transmissive modules.

In other embodiments, the embodiments mentioned above can be mixed on a same display panel. When the gaps between non-transmissive modules such as the wiring 13, the thin film transistors 14, etc. are large, the added opening regions can be defined on regions on the invalid light emitting region of the display panel and are different from regions where orthogonal projections of each of the non-transmissive modules are located on (please refer to region 16 in FIG. 4(b)). When the gaps between the non-transmissive modules such as the wiring 13, the thin film transistor 14, etc. are relatively small, the added opening regions are defined on the invalid light emitting regions of the display panel and cover and exceed regions where orthogonal projections of each of the non-transmissive modules are located on (please refer to region 17 in FIG. 4(b)).

Figure 5:
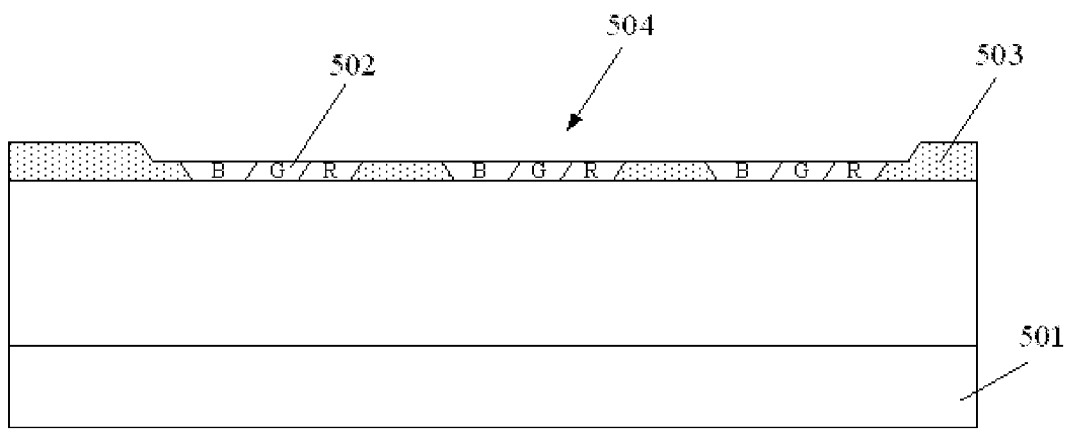
FIG. 5 is a basic structural schematic diagram of a fourth display panel with a high aperture ratio provided by an embodiment of the present disclosure.

Please refer to FIG. 5, the display panel provided by the present disclosure can further include a substrate 501, a color filter layer 502, and a barrier layer 503. Added opening regions 504 are defined on regions where the invalid light emitting regions on the barrier layer 503 are located on. The color filter layers 502 are formed in the added opening regions 504. It should be noted that the regions where the color filter layer 502 are formed in the added opening regions are added effective light emitting regions.

Figure 6:
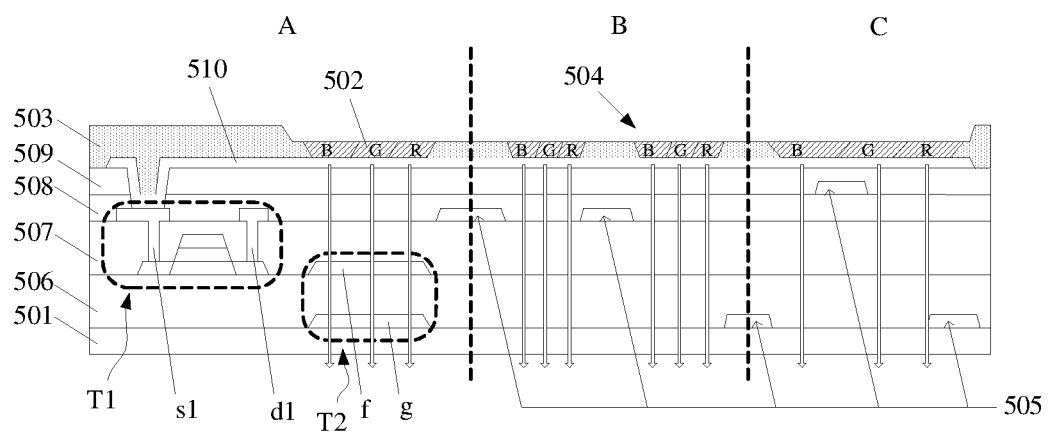
FIG. 6 is a refined structural schematic diagram of a fifth display panel with a high aperture ratio provided by an embodiment of the present disclosure.

Please refer to FIG. 6, at least a thin film transistor T1, a metal layer block 505, a buffer layer 506, a dielectric layer 507, a passivation layer 508, a planarization layer 509, and an anode layer 510 are formed on the substrate 501.

Furthermore, the thin film transistor T1 is formed in the dielectric layer 507, and a first source electrode s1, a first drain electrode d1, and the metal layer block 505 are formed on the dielectric layer 507. The passivation layer 508 covers the dielectric layer 507, the metal layer block 505, and the first source electrode s1 and the first drain electrode d1 of the thin film transistor T1. The planarization layer 509 is formed on the passivation layer 508. The anode layer 510 contacts to the passivation layer 508. The barrier layer 503 is formed on the anode layer 510. The added opening regions 504 is defined on a region where the invalid light emitting regions on the barrier layer 503 is located on.

It should be understood that T1, metal layer block 505 in FIG. 6 are non-transmissive modules, while a storage capacitor T2 in FIG. 6 is a transmissive module. Furthermore, the storage capacitor T2 includes indium gallium zinc oxide (IGZO) g and indium tin oxide (ITO) f, and the two modules are transmissive.

Please refer to FIG. 6 again, the figure is the display panel provided by the present disclosure, wherein a first region A can be understood as a structural schematic diagram of a lateral surface of a traditional display panel, and a second region B and a third region C in the traditional display panel where there are no added opening regions 504 are the invalid light emitting regions. However, in the display panel provided by the present disclosure, the added opening regions 504 are defined on the second region B and the third region C. In the second region B, the added opening regions 504 are defined on regions different from orthogonal projections of each of the non-transmissive modules. In the third region C, the added opening regions 504 are defined on the region covering and exceeding orthogonal projections of each of the non-transmissive modules. In this embodiment, the non-transmissive modules are mainly the metal layer block 505.

The present disclosure further provides a display device. The display device includes any one of the display panels mentioned above. The display device can be intelligent terminals, such as mobile phones, tablet PCs, computer display devices, etc. and can also be any devices requiring display functions such as televisions, microwave ovens, etc.

Figure 7:
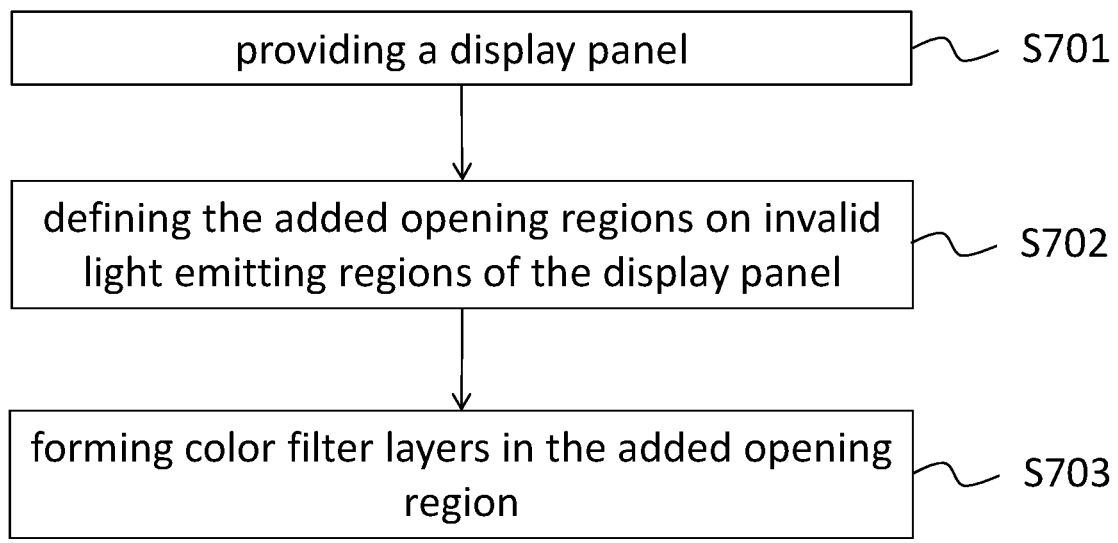
FIG. 7 is a basic flowchart of a manufacturing method of a display panel with a high aperture ratio provided by an embodiment of the present disclosure.

The present disclosure further provides a manufacturing method of the display panel with a high aperture ratio. Please refer to FIG. 7, the method includes:

S701: providing a display panel.

The effective light emitting region of the display panel is the region where the color filter layer in the pixel opening region is formed, and other region of the display panel is the invalid light emitting region. Further, it should be understood that a surface layer of the display panel is a barrier layer.

S702: defining the added opening regions on invalid light emitting regions of the display panel.

The surface layer of the display panel is the barrier layer, and the added opening regions are defined on the barrier layer by methods such as etching, etc.

S703: forming color filter layers in the added opening region.

It should be noted that regions where the color filter layers in the added opening regions on the display panel are located on are added effective light emitting regions.

The embodiment of the present disclosure provides the manufacturing method of the display panel with the high aperture ratio, which is defining the added opening regions on the invalid light emitting regions of the display panel, forming the color filter layers in the added opening regions, and adding one or a plurality of the effective light emitting region on the invalid light emitting regions. Therefore, on the basis of the method provided by the present disclosure, the aperture ratio and the pixel density of the display panel can be increased to achieve the purpose of improving display effect of the display panel.

In other embodiments, at least one non-transmissive module is formed in the display panel. It should be understood that the non-transmissive module includes a thin film transistor, a metal layer block, and a black matrix. The transmissive module includes transparent modules such as storage capacitors, etc.

S801: providing a display panel.

The effective light emitting region of the display panel is the region where the color filter layers in the pixel opening region are formed, and other region of the display panel is the invalid light emitting region. Further, it should be understood that a surface layer of the display panel is a barrier layer.

S802: determining regions where orthogonal projections of each of the non-transmissive modules are located in the invalid light emitting regions of the display panel.

S803: defining an added opening region on regions different from the orthogonal projections of each of the non-transmissive modules on the barrier layer of the display panel.

The surface layer of the display panel is the barrier layer, and the added opening region is defined on the barrier layer by methods such as etching, etc.

S804: forming color filter layers in the added opening regions.

Compared to the step S803, in other embodiments, on the barrier layer of the display panel, the added opening regions can be defined on regions covering and exceeding the orthogonal projections of each of the non-transmissive modules.

By the steps mentioned above, the display panel with the high aperture ratio in each of the embodiments mentioned above can be obtained.

It should be noted that all the method embodiments mentioned above are described as motion combinations for convenience, it should be known those skilled in the art that the present disclosure should not be limited to the motion sequence described, this is because some other sequences can be adopted when some procedures are implemented or some procedures can be implemented at the same time in the present invention. Secondly, it should be known to those skilled in the art that the embodiments described in the specification belong to preferable embodiments, the motion and the modules involved are not all necessary for the present disclosure.

In the embodiments mentioned above, the descriptions to the various embodiments are emphasized, and the part is not described in detailed in an embodiment, can refer to the detailed description of other embodiments mentioned above. Meanwhile, the serial numbers of the embodiments of the present disclosure are merely for the description, and do not represent the advantages and disadvantages of the embodiments. In the inspiration of the present disclosure, those ordinary skills in the art can also make many modifications without departing from the subject of the present disclosure and the protection scope of the claims. All these modifications belong to the protection of the present disclosure.

In the description of this specification, reference terms such as "some embodiments", "one embodiment", "several embodiments", "explanatory embodiments", "an example," "a specific example", or "some examples", means that a particular feature, structure, material, or characteristic described in connection with the embodiment or example is included in at least one embodiment or example of the present disclosure. In this specification, the terms mentioned above are not necessarily referring to the same embodiment or example of the present disclosure. Furthermore, the described particular features, structures, materials, or characteristics may be combined in any appropriate manner in one or more embodiments or examples.

Although the embodiments of the present disclosure have been shown and described, the embodiments mentioned above are merely exemplary, rather than limiting the present disclosure. Various changes, modifications and alterations may be made to the present disclosure for a person skilled in the art. The scope of the present disclosure is defined in the claims and their equivalents.

What is claimed is:

1. A display panel with a high aperture ratio, wherein the display panel comprises a plurality of effective light emitting regions and a plurality of invalid light emitting region, a plurality of added opening regions are defined on the plurality of invalid light emitting regions of the display panel, a plurality of color filter layers are formed in the plurality of added opening regions, and regions where the plurality of color filter layers in the plurality of added opening regions on the display panel are located on are a plurality of added effective light emitting regions.

2. The display panel as claimed in claim 1, wherein at least one non-transmissive module is formed in the display panel;
the plurality of added opening regions are defined on regions on the plurality of invalid light emitting regions of the display panel and are different from regions where orthogonal projections of each of the non-transmissive modules are located on.

3. The display panel as claimed in claim 2, wherein the non-transmissive module comprises a thin film transistor, a metal layer block, or/and a black matrix.

4. The display panel as claimed in claim 1, wherein at least one non-transmissive module is formed in the display panel;
the plurality of added opening regions are defined on the invalid light emitting regions of the display panel and cover and exceed regions where orthogonal projections of each of the non-transmissive modules are located on.

5. The display panel as claimed in claim 4, wherein the non-transmissive module comprises a thin film transistor, a metal layer block, or/and a black matrix.

6. The display panel as claimed in claim 1, wherein the display panel comprises:
a substrate, wherein at least a thin film transistor, a metal layer block, a dielectric layer, a passivation layer, and an anode layer are formed on the substrate, the thin film transistor is formed in the dielectric layer, a first source electrode and a first drain electrode of the thin film transistor and the metal layer block are formed on the dielectric layer, the passivation layer covers the dielectric layer, the metal layer block, and the first source electrode and the first drain electrode of the thin film transistor, and the anode layer contacts the passivation layer; and
a barrier layer, wherein the barrier layer is formed on the anode layer and the passivation layer, the plurality of added opening regions are defined on the plurality of invalid light emitting regions on the barrier layer, and the plurality of color filter layers are formed in the plurality of added opening regions.

7. A display device, wherein a display panel of the display device comprises a plurality of effective light emitting regions and a plurality of invalid light emitting region, a plurality of added opening regions are defined on the plurality of invalid light emitting regions of the display panel, a plurality of color filter layers are formed in the plurality of added opening regions, and regions where the plurality of color filter layers in the plurality of added opening regions on the display panel are located on are a plurality of added effective light emitting regions.

8. The display device as claimed in claim 7, wherein at least one non-transmissive module is formed in the display panel;
the plurality of added opening regions are defined on regions on the plurality of invalid light emitting regions of the display panel and are different from regions where orthogonal projections of each of the non-transmissive modules are located on.

9. The display device as claimed in claim 8, wherein the non-transmissive module comprises a thin film transistor, a metal layer block, or/and a black matrix.

10. The display device as claimed in claim 7, wherein at least one non-transmissive module is formed in the display panel;

the plurality of added opening regions are defined on the plurality of invalid light emitting regions of the display panel and cover and exceed regions where orthogonal projections of each of the non-transmissive modules are located on.

11. The display device as claimed in claim 10, wherein the non-transmissive module comprises a thin film transistor, a metal layer block, or/and a black matrix.

12. The display device as claimed in claim 7, wherein the display panel comprises:
- a substrate, wherein at least a thin film transistor, a metal layer block, a dielectric layer, a passivation layer, and an anode layer are formed on the substrate, the thin film transistor is formed in the dielectric layer, a first source electrode and a first drain electrode of the thin film transistor and the metal layer block are formed on the dielectric layer, the passivation layer covers the dielectric layer, the metal layer block, and the first source electrode and the first drain electrode of the thin film transistor, and the anode layer contacts the passivation layer; and
- a barrier layer, wherein the barrier layer is formed on the anode layer and the passivation layer, the plurality of added opening regions are defined on the plurality of invalid light emitting regions on the barrier layer, and the plurality of color filter layers plurality are formed in the plurality of added opening regions.

13. A manufacturing method of a display panel with a high aperture ratio, comprising
- providing the display panel, wherein the display panel comprises a plurality of effective light emitting regions and a plurality of invalid light emitting regions; and
- defining a plurality of added opening regions on the plurality of invalid light emitting regions of the display panel, and forming a plurality of color filter layers in the plurality of added opening regions, wherein regions where the plurality of color filter layers in the plurality of added opening regions on the display panel are located on are a plurality of added effective light emitting regions.

14. The manufacturing method of the display panel as claimed in claim 13, wherein at least one non-transmissive module is formed in the display panel, a surface layer of the display panel is a barrier layer, and defining the plurality of added opening regions on the plurality of invalid light emitting regions of the display panel comprises:
- determining regions where orthogonal projections of each of the non-transmissive modules are located in the plurality of invalid light emitting regions of the display panel; and
- defining the plurality of added opening regions on regions different from the orthogonal projections of each of the non-transmissive modules on the barrier layer of the display panel.

15. The manufacturing method of the display panel as claimed in claim 14, wherein the non-transmissive module comprises a thin film transistor, a metal layer block, or/and a black matrix.

16. The manufacturing method of the display panel as claimed in claim 13, wherein at least one non-transmissive module is formed in the display panel, a surface layer of the display panel is a barrier layer, and defining the plurality of added opening regions on the invalid light emitting region of the display panel comprises:
- determining regions where orthogonal projections of each of the non-transmissive modules are located in the plurality of invalid light emitting regions of the display panel; and
- defining the plurality of added opening regions covering and exceeding regions where the orthogonal projections of each of the non-transmissive modules are located on, on the barrier layer of the display panel.

17. The manufacturing method of the display panel as claimed in claim 16, wherein the non-transmissive module comprises a thin film transistor, a metal layer block, or/and a black matrix.

* * * * *